United States Patent [19]

Hinks et al.

[11] Patent Number: 5,281,916
[45] Date of Patent: Jan. 25, 1994

[54] NMR ANGIOGRAPHY USING FAST SPIN ECHO PULSE SEQUENCES

[75] Inventors: Richard S. Hinks; Matthew A. Bernstein, both of Waukesha, Wis.

[73] Assignee: General Electric Company, Milwaukee, Wis.

[21] Appl. No.: 921,532

[22] Filed: Jul. 29, 1992

[51] Int. Cl.[5] .............................................. G01R 33/20
[52] U.S. Cl. ................................... 324/309; 324/300; 324/306
[58] Field of Search ............... 324/300, 306, 307, 309; 128/653.2, 653.3

[56] References Cited

U.S. PATENT DOCUMENTS 4,683,431 7/1987 Pattany et al. ....................... 324/309
4,718,424 1/1988 Nishimura ............................ 324/309

OTHER PUBLICATIONS

Contrast Manipulation and Artifact Assessment of 2D and 3D Rare Sequences, Magnetic Resonance Imaging, vol. 8 pp. 557–566, 1990, R. V. Mulkern, et al.
Three-Dimensional Phase Contrast Angiography, Magnetic Resonance in Medicine 9, 139–149 (1989), C. L. Dumoulin, et al.
Encoding Strategies for Three-Direction Phase-Contrast MR Imaging of Flow[1], JMRI 1991: 1:405–413, N. J. Pelc, et al.
Comparison of Phase-Difference and Complex-Difference Processing in Phase-Contrast MR Angiography[1], JMRI 1991: 1:725–729, M. A. Bernstein, et al.
Projection Angiograms of Blood Labeled by Adiabatic Fast Passage, Magnetic Resonance In Medicine 3, 454–462 (1986), W. T. Dixon, et al.
Rare Imaging: A Fast Imaging Method for Clinical MR, Magnetic Resonance In Medicine 3, 823–833 (1986), J. Hennig, et al.

Primary Examiner—Michael J. Tokar
Assistant Examiner—Raymond Y. Mah
Attorney, Agent, or Firm—Quarles & Brady

[57] ABSTRACT

An NMR angiogram is produced from two data sets acquired using a fast pulse sequence. One data set is acquired with a readout gradient having a first moment of zero at each refocusing pulse and a first value at each acquired echo signal. A second data set is acquired with a readout gradient having a first moment of zero at each refocusing pulse and a second value at each acquired echo signal. Signals from stationary tissues are suppressed with a dephasing gradient pulse in the slice select direction applied after each refocusing pulse, and a corresponding rewinder gradient pulse is applied after each acquired echo signal.

5 Claims, 5 Drawing Sheets

NMR ANGIOGRAPHY USING FAST SPIN ECHO PULSE SEQUENCES

BACKGROUND OF THE INVENTION

The field of the invention is nuclear magnetic resonance imaging methods and systems. More particularly, the invention relates to the use of fast spin echo NMR echo pulse sequences to produce images of moving spins.

Any nucleus which possesses a magnetic moment attempts to align itself with the direction of the magnetic field in which it is located. In doing so, however, the nucleus precesses around this direction at a characteristic angular frequency (Larmor frequency) which is dependent on the strength of the magnetic field and on the properties of the specific nuclear species (the magnetogyric constant $\gamma$ of the nucleus). Nuclei which exhibit this phenomena are referred to herein as "spins".

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. A net magnetic moment $M_z$ is produced in the direction of the polarizing field, but the randomly oriented magnetic components in the perpendicular, or transverse, plane (x-y plane) cancel one another. If, however, the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$, which is rotating, or spinning, in the x-y plane at the Larmor frequency. The practical value of this phenomenon resides in the signal which is emitted by the excited spins after the excitation signal $B_1$ is terminated. There are a wide variety of measurement sequences in which this nuclear magnetic resonance ("NMR") phenomena is exploited.

When utilizing NMR to produce images, a technique is employed to obtain NMR signals from specific locations in the subject. Typically, the region which is to be imaged (region of interest) is scanned by a sequence of NMR measurement cycles which vary according to the particular localization method being used. The resulting set of received NMR signals are digitized and processed to reconstruct the image using one of many well known reconstruction techniques. To perform such a scan, it is, of course, necessary to elicit NMR signals from specific locations in the subject. This is accomplished by employing magnetic fields ($G_x$, $G_y$, and $G_z$) which have the same direction as the polarizing field $B_0$, but which have a gradient along the respective x, y and z axes. By controlling the strength of these gradients during each NMR cycle, the spatial distribution of spin excitation can be controlled and the location of the resulting NMR signals can be identified.

The concept of acquiring NMR image data in a short time period has been known since 1977 when the echo-planar pulse sequence was proposed by Peter Mansfield (J. Phys. C.10: L55-L58, 1977). In contrast to standard pulse sequences, the echo-planar pulse sequence produces a set of NMR signals for each RF excitation pulse. These NMR signals can be separately phase encoded so that an entire scan of 64 views can be acquired in a single pulse sequence of 20 to 100 milliseconds in duration.

A variant of the echo planar imaging method is the Rapid Acquisition Relaxation Enhanced (RARE) sequence which is described by J. Hennig et al in an article in *Magnetic Resonance in Medicine* 3,823-833 (1986) entitled "RARE Imaging: A Fast Imaging Method for Clinical MR." The essential difference between the RARE sequence and the EPI sequence lies in the manner in which echo signals are produced. The RARE sequence utilizes RF refocused echoes generated from a Carr-Purcell-Meiboom-Gill sequence, while EPI methods employ gradient recalled echoes.

Both of these "fast spin echo" imaging methods involve the acquisition of multiple spin echo signals from a single excitation pulse in which each acquired echo signal is separately phase encoded. Each pulse sequence, or "shot," therefore results in the acquisition of a plurality of views, and single shot scans are commonly employed with the EPI method. However, a plurality of shots are typically employed to acquire a complete set of image data when the RARE fast spin echo sequence is employed. For example, a RARE pulse sequence might acquire 8 or 16 separate echo signals, per shot, and an image requiring 256 views would, therefore, require 32 or 16 shots respectively.

There are a number of well known NMR techniques for measuring the motion, or flow of spins within the region of interest. These include the "time-of-flight" method in which a bolus of spins is excited as it flows past a specific upstream location and the state of the resulting transverse magnetization is examined at a downstream location to determine the velocity of the bolus. This method has been used for many years to measure flow in pipes, and in more recent years it has been used to measure blood flow in human limbs. Examples of this method are disclosed in U.S. Pat. Nos. 3,559,044; 3,191,119; 3,419,793 and 4,777,957.

A second flow measurement technique is the inflow/outflow method in which the spins in a single, localized volume or slice are excited and the change in the resulting transverse magnetization is examined a short time later to measure the effects of excited spins that have flowed out of the volume or slice, and the effects of differently excited spins that have flowed into the volume or slice. Examples of this method are described in U.S. Pat. Nos. 4,574,239; 4,532,474 and 4,516,582.

A third technique for measuring motion flow relies upon the fact that an NMR signal produced by spins flowing through a magnetic field gradient experiences a phase shift which is proportional to velocity. This is referred to in the art as the "phase modulation" technique. For flow that has a roughly constant velocity during the measurement cycle the change in phase of the NMR signal is given as follows:

$$\Delta\phi = \gamma M_1 v$$

where $M_1$ is the first moment of the magnetic field gradient, $\gamma$ is the gyromagnetic ratio and v is the velocity of the spins. To eliminate errors in this measurement due to phase shifts caused by other sources, it is common practice to perform the measurement at least twice with different magnetic field gradient moments as described in U.S. Pat. No. 4,609,872. The difference in phase at any location between the two measurements is then as follows:

$$\Delta\phi = \gamma \Delta M_1 v$$

By performing two complete scans with different magnetic field gradient first moments and subtracting the measured phases in the reconstructed image at each location in the acquired data arrays, a phase map is produced which accurately measures the velocity of constantly moving spins. Such phase maps may be processed to reconstruct an angiogram in which stationary tissues are dark and the vascular tree is bright.

The phase modulation method for producing an NMR angiogram typically employs a conventional gradient recalled echo pulse sequence and requires up to a few minutes to complete a scan. Compared to spin echo pulse sequences, gradient recalled echo sequences may suffer from reduced SNR and reduced immunity to off-resonance effects such as field inhomogeneity and magnetic susceptibility. When the phase modulation method is applied to conventional spin echo pulse sequences, as to overcome one or more limitations of the gradient recalled echo method, many minutes are required to complete the scan. The application of the phase modulation technique to a fast spin echo pulse sequence, on the other hand, would allow completion of a scan and reconstruction of an angiogram in less than a minute.

SUMMARY OF THE INVENTION

The present invention relates to a method and machine for producing an NMR angiogram using the phase modulation method and a fast spin echo pulse sequence. More specifically, the present invention employs an NMR scanner to produce an angiogram using a fast spin echo pulse sequence in which a first FSE pulse sequence employs a magnetic field gradient to impart a net first moment at each NMR echo signal to sensitize each NMR echo signal to motion along the direction of the gradient and to null the first moment at each RF refocusing pulse therein to maintain phase coherence between the primary echo and stimulated echo signal components. A second FSE pulse sequence is employed with a second net first moment at each NMR echo signal and the difference information in the NMR echo signals acquired from the first and second FSE pulse sequences is used to produce data from which an angiogram image is reconstructed.

A general object of the invention is to produce an NMR angiogram using a fast spin echo pulse sequence. Because the NMR echo signals in an FSE pulse sequence are composed of components from primary echoes and stimulated echoes, it is necessary to separately deal with the phase of each component to avoid signal cancellation. This is accomplished by nulling the first gradient moment at each RF refocusing pulse while providing the desired first gradient moment at each NMR echo signal.

Yet another object of the invention is to increase the dynamic range of the scan by reducing the signal in an NMR angiogram due to stationary tissues. This is accomplished by adding a dephasing gradient pulse to each slice select gradient pulse following each RF refocusing pulse and prior to each NMR echo signal acquisition, and adding a corresponding rewinder gradient pulse to each slice select gradient pulse after each NMR echo signal acquisition and prior to the subsequent RF refocusing pulse. The dephasing gradient pulse reduces spatial low frequency NMR signals caused by stationary tissues thereby enabling increased sensitivity to the signals produced by smaller structures such as blood vessels and enhanced contrast in the image.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

DESCRIPTION OF THE PREFERRED EMBODIMENT

Figure 1:
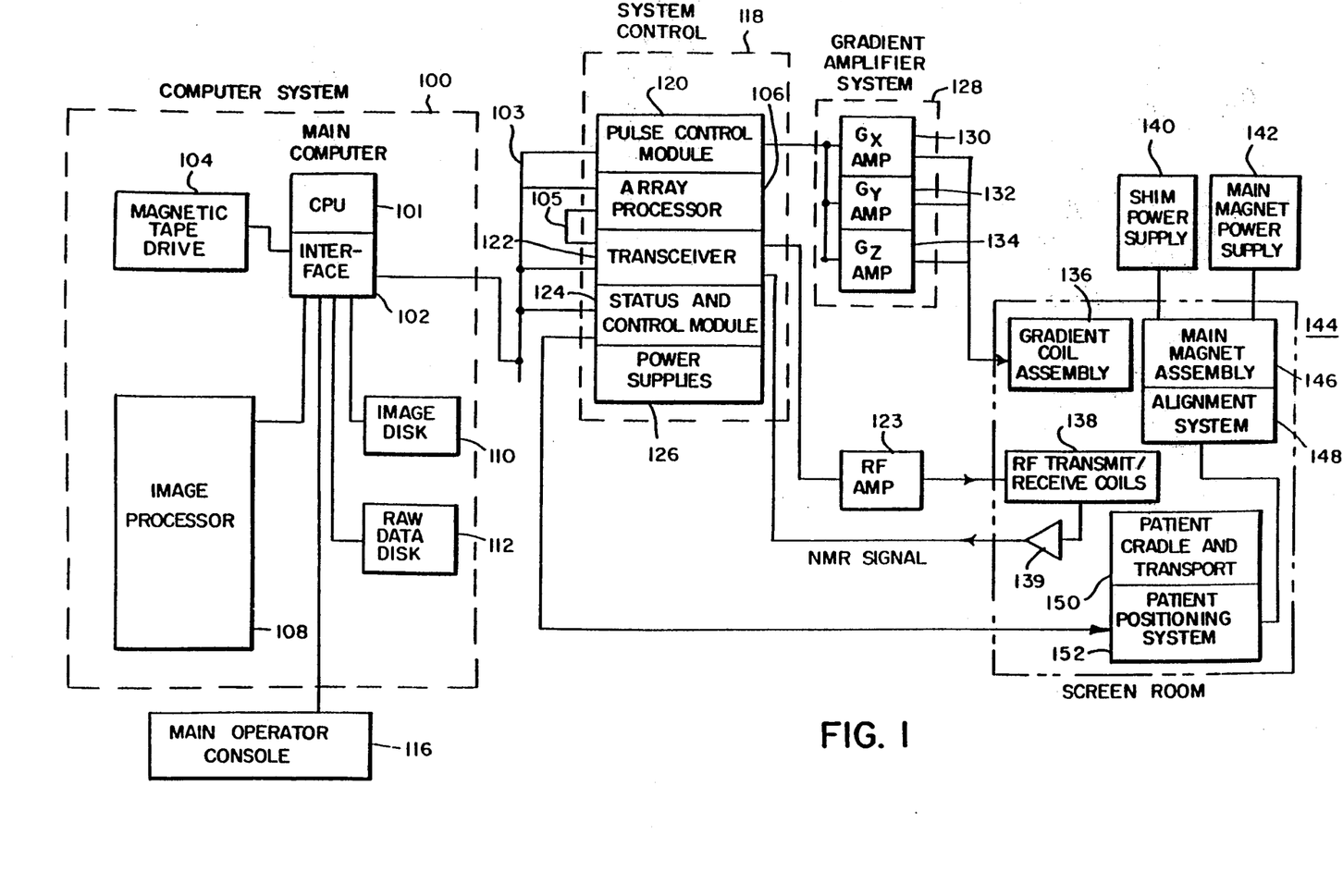
FIG. 1 is a block diagram of an NMR system which employs the present invention.

Referring first to FIG. 1, there is shown in block diagram form the major components of a preferred NMR system which incorporates the present invention and which is sold by the General Electric Company under the trademark "SIGNA". The overall operation of the system is under the control of a host computer system generally designated 100 which includes a main computer 101 (such as a Data General MV7800). The computer has associated therewith an interface 102 through which a plurality of computer peripheral devices and other NMR system components are coupled. Among the computer peripheral devices is a magnetic tape drive 104 which may be utilized under the direction of the main computer for archiving patient data and images to tape. Processed patient data may also be stored in an image disc storage device designated 110. The function of image processor 108 is to provide interactive image display manipulation such as magnification, image comparison, gray-scale adjustment and real-time data display. The computer system is provided with a means to store raw data (i.e. before image construction) utilizing a disc data storage system designated 112. An operator console 116 is also coupled to the computer by means of interface 102 and provides the operator with the means to input data pertinent to a patient study as well as additional data necessary for proper NMR system operation, such as calibrating, initiating and terminating scans. The operator console is also used to display images stored on discs or magnetic tape.

The computer system 100 exercises control over the NMR system by means of system control 118 and gradient amplifier system 128. The computer 100 communicates with system control 118 by means of a link 103 in a manner well known to those skilled in the art. The system control 118 includes several subsystems such as a pulse control module (PCM) 120, an array processor 106, a radio frequency transceiver 122, a status and control module (SCM) 124, and the power supplies generally designated 126 necessary to energize the components. The PCM 120 utilizes control signals provided by main computer 101 to generate digital timing and control signals such as the digital waveforms which control gradient coil excitation, as well as RF envelope waveforms utilized in the transceiver 122 for modulating the RF excitation pulses. The gradient waveforms are applied to the gradient amplifier system 128 generally comprised of $G_x$, $G_y$ and $G_z$ amplifiers 130, 132 and 134, respectively. Each amplifier 130, 132 and 134 is utilized to excite a corresponding gradient coil in an assembly generally designated 136. When energized, the gradient coils generate magnetic field gradients $G_x$, $G_y$ and $G_z$ of the magnetic field in the same direction as the main polarizing magnetic field, wherein the gradients are directed in mutually orthogonal X-, Y- and Z-axis directions of a Cartesian coordinate system. That is, if the magnetic field generated by the main magnet (not shown) is directed in the z direction and is termed $B_0$, and the total magnetic field in the z direction is referred to as $B_z$, then $G_x = \partial B_z/\partial x$, $G_y = \partial B_z/\partial y$ and $G_z = \partial B_z/\partial z$, and the magnetic field at any point (x, y, z) is given by $B(x, y, z) = B_0 + G_x X + G_y Y + G_z Z$.

The gradient magnetic fields are utilized in combination with radio frequency pulses generated by transceiver 122, RF amp 123 and RF coil 138 to encode spatial information into the NMR signals emanating from the region of the patient being studied. Waveforms and control signals provided by the pulse control module 120 are utilized by the transceiver subsystem 122 for RF carrier modulation and mode control. In the transmit mode, the transmitter provides a radio frequency waveform modulated in accordance with the control signals to an RF power amplifier 123 which then energizes RF coil 138 which is situated within main magnet assembly 146. The NMR signals radiated by the excited nuclei in the patient are sensed by the same or a different RF coil than is used for transmitting and amplified by a preamplifier 139. The NMR signals are amplified, demodulated, filtered, and digitized in the receiver section of the transceiver 122. The processed NMR signals are transmitted to the array processor 106 for processing by means of a dedicated, unidirectional link 105.

The PCM 120 and SCM 124 are independent subsystems both of which communicate with main computer 101, peripheral system, such as patient positioning system 152, as well as to one another by means of serial communications link 103. The PCM 120 and SCM 124 are each comprised of a 16-bit microprocessor (such as Intel 80286) for processing commands from the main computer 101. The SCM 124 includes means for acquiring information regarding patient cradle position, and the position of the moveable patient alignment light fan beam (not shown). This information is used by main computer 101 to modify image display and reconstruction parameters. The SCM 124 also initiates functions such as actuation of the patient transport and alignment systems.

The gradient coil assembly 136 and the RF transmit and receiver coils 138 are mounted within the bore of the magnet utilized to produce the polarizing magnetic field. The magnet forms a part of the main magnet assembly which includes the patient alignment system 148. A shim power supply 140 is utilized to energize a shim coil associated with the main magnet and which are used to correct inhomogeneities in the polarizing magnet field. In the case of a superconductive magnet, the main power supply 142 is utilized to bring the polarizing field produced by the magnet to the proper operating strength and is then disconnected. The patient alignment system 148 operates in combination with a patient cradle and transport system 150 and patient positioning system 152. To minimize interference from external sources, these NMR system components are enclosed in an RF-shielded room generally designated 144.

Figure 2:
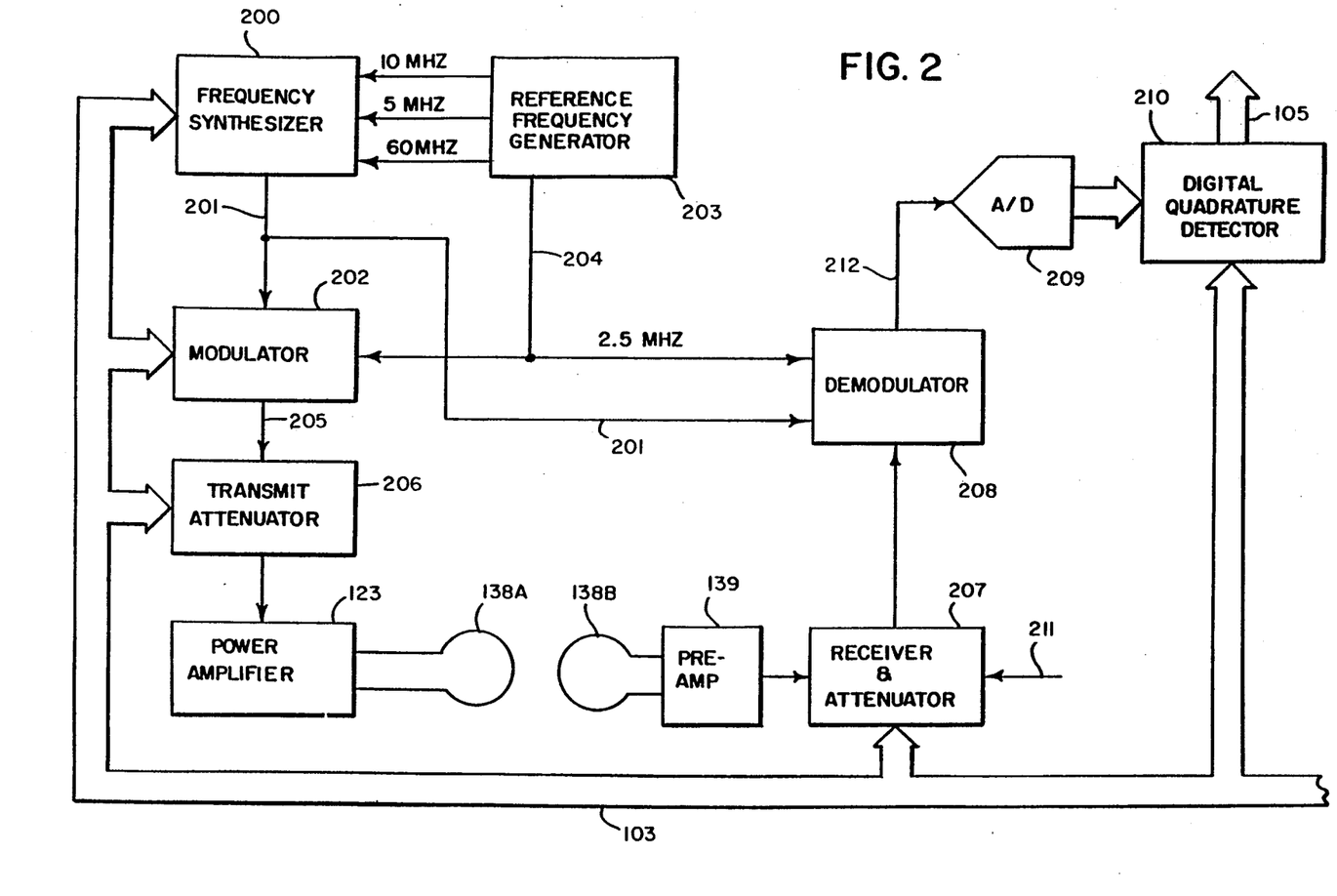
FIG. 2 is an electrical block diagram of the transceiver which forms part of the NMR system of FIG. 1.

Referring particularly to FIGS. 1 and 2, the transceiver 122 includes components which produce the RF excitation field $B_1$ through power amplifier 123 at a coil 138A and components which receive the resulting NMR signal induced in a coil 138B. The base, or carrier, frequency of the RF excitation field is produced under control of a frequency synthesizer 200 which receives a set of digital signals (CF) through the communications link 103 from the main computer 101. These digital signals indicate the frequency and phase of the RF carrier signal which is produced at an output 201. The commanded RF Carrier is applied to a modulator 202 where it is modulated in response to a signal R(t) received through the link 103 from the PCM 120. The signal R(t) defines the envelope, and therefore the bandwidth, of the RF excitation pulse to be produced. It is produced in the PCM 120 by sequentially reading out a series of stored digital values as the RF excitation pulse is produced that represent the desired envelope. These stored digital values may, in turn, be changed by the computer 100 to enable any desired RF pulse envelope to be produced. The magnitude of the RF excitation pulse output through line 205 is attenuated by a transmit attenuator circuit 206 which receives a digital signal, TA, from the main computer 101 through communications link 103. The attenuated RF excitation pulses are applied to the power amplifier 123 that drives the RF transmitter coil 138A. For a more detailed description of this portion of the transceiver 122, reference is made to U.S. Pat. No. 4,952,877 which is incorporated herein by reference.

Referring still to FIGS. 1 and 2 the NMR signal produced by the subject is picked up by the receiver coil 138B and applied to the input of a receiver 207. The receiver 207 amplifies the NMR signal and this is attenuated by an amount determined by a digital attenuation signal (RA) received from the main computer 101 through link 103. The receiver 207 is also turned on and off by a signal through line 211 from the PCM 120 such that the NMR signal is acquired only over the time intervals required by the particular acquisition being performed.

The received NMR signal is at or around the Larmor frequency, which in the preferred embodiment is around 63.86 MHz. This high frequency signal is demodulated in a two step process in a demodulator 208 which first mixes the NMR signal with the carrier signal on line 201 and then mixes the resulting difference signal with the 2.5 MHz reference signal on line 204. The resulting demodulated NMR signal on line 212 has a bandwidth of 125 kHz and it is centered at a frequency of 187.5 kHz. The demodulated NMR signal is applied to the input of an analog-to-digital (A/D) converter 209 which samples and digitizes the analog signal at a rate of 250 kHz. The output of the A/D converter 209 is applied to a digital quadrature detector 210 which produces 16-bit in-phase (I) values and 16-bit quadrature (Q) values corresponding to the received digital signal. The resulting stream of digitized I and Q values of the received NMR signal is output through bus 105 to the array processor where they are employed to reconstruct an image.

To preserve the phase information contained in the received NMR signal, both the modulator 202 in the transmitter section and the demodulator 208 in the receiver section are operated with common signals. More particularly, the carrier signal at the output 201 of the frequency synthesizer 200 and the 2.5 MHz reference signal at the output 204 of the reference frequency generator 203 are employed in both the modulation and the demodulation process. Phase consistency is thus maintained and phase changes in the demodulated received NMR signal accurately indicate phase changes produced by the excited spins. The 2.5 MHz reference signal as well as 5, 10 and 60 MHz reference signals are produced by the reference frequency generator 203 from a common 10 MHz clock signal, and the latter three reference signals are employed by the frequency synthesizer 200 to produce the carrier signal on output 201. For a more detailed description of the receiver, reference is made to U.S. Pat. No. 4,992,736 which is incorporated herein by reference.

Figure 3:
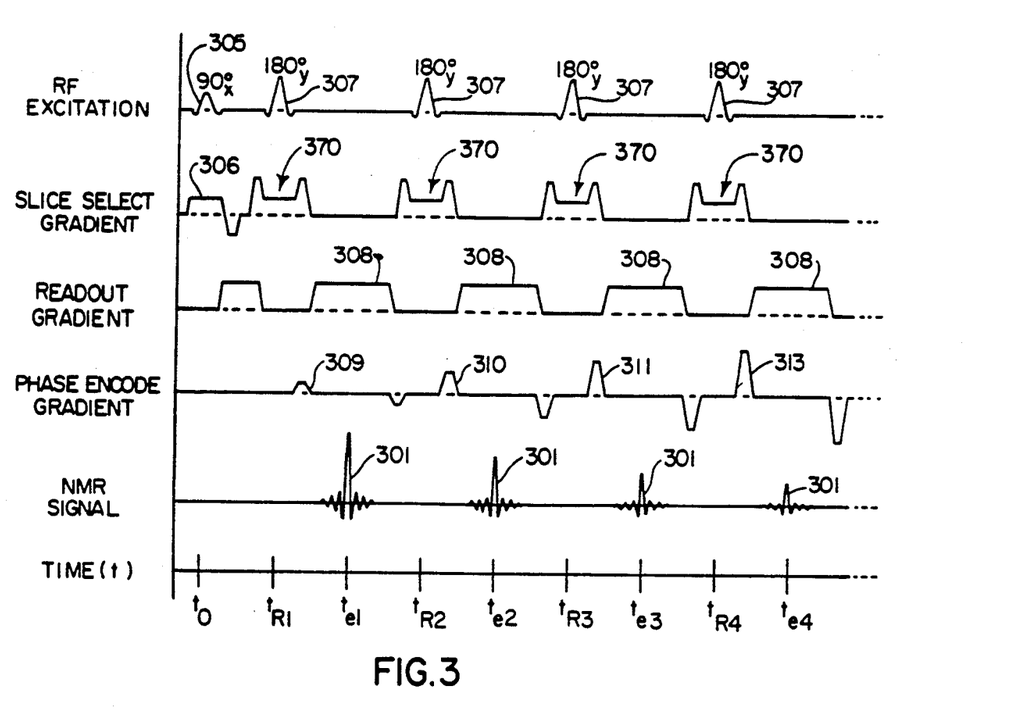
FIG. 3 is a graphic representation of a conventional fast spin echo pulse sequence.

Referring particularly to FIG. 3, a conventional fast spin echo NMR pulse sequence, referred to in the art as a 2DFT RARE sequence, is shown in which sixteen NMR echo signals are acquired. For clarity, only four echo signals 301 are shown in FIG. 3, but it can be appreciated that twelve more are produced and acquired. These NMR echo signals are produced by a 90° RF excitation pulse 305 which is generated in the presence of a $G_z$ slice select gradient pulse 306 to provide transverse magnetization in a slice through the patient. This transverse magnetization is refocused by each of sixteen selective 180° RF refocusing pulses 307 to produce the NMR spin echo signals 301 that are acquired in the presence of $G_x$ readout gradient pulses 308. In the preferred embodiment the 180° RF refocusing pulses 107 occur every 14 milliseconds, and the center of the first one occurs 7 milliseconds after the center of the 90° RF excitation pulse 305. Each NMR spin echo signal 301 is separately phase encoded by respective $G_y$ phase encoding pulses 309-313. The magnitude of each phase encoding pulse is different, and it is stepped through 256 values to acquire 256 separate views during a complete scan. Each NMR spin echo signal is acquired by digitizing 256 samples of each signal. As a result, at the completion of a scan for one image, 16 shots (256/16=16) of the pulse sequence of FIG. 3 have been executed and a 256 by 256 element array of complex numbers have been acquired. An image is reconstructed by performing a 2D Fourier transformation on this image data array and then calculating the absolute value of each resulting complex element. A 256 by 256 pixel image is thus produced in which the brightness of each pixel is determined by the magnitude of its corresponding element in the transformed array.

The present invention is an improvement in the CPMG NMR pulse sequence of FIG. 3 in which one or more of the gradient fields are changed to provide first moment nulling at each of the 180° RF refocusing pulses 307 and to provide a motion sensitizing gradient first moment at each NMR spin echo signal.

The first moment of a gradient field G(t) is given by the following expression:

$$M_1 = \int_{\infty}^{\infty} G(t) \, t \, dt$$

where:
G = amplitude of gradient field
t = time

To null the phase errors which the gradient G(t) will impose on the NMR signals produced by moving spins, this expression should equal zero over the time interval in which the spins are transversely magnetized. Referring to FIG. 3, transverse magnetization may be considered to be produced at the center of the 90° RF excitation pulse 305 at time $t_0$, this magnetization is reversed by the 180° RF refocusing pulse 307 at time $t_{R1}$, and the first NMR echo signal 301 is acquired about the time $t_{e1}$. A second RF refocusing pulse is applied at time $t_{R2}$, a second NMR echo signal is acquired at time $t_{e2}$, and the sequence repeats until all NMR echo signals 301 in the shot have been acquired. It is a teaching of the present invention that the above expression for the gradient first moment be controlled for the time period $t_0$ to $t_{R1}$ and for each subsequent time period between RF refocusing pulses 307 ($t_{R1}$ to $t_{R2}$, $t_{R2}$ to $t_{R3}$, ... $t_{Rn-1}$ to $t_{Rn}$). In the preferred embodiment, the gradient first moment is controlled by setting it to zero during each of the relevant time intervals.

It is a further teaching of the present invention that the NMR spin echo signals 301 can be velocity sensitized if the above expression for the gradient first moment is set to a non-zero value for the time interval between transverse excitation $t_0$ and the center of the first NMR echo signal $t_{e1}$, and for each subsequent time interval between NMR echo signals ($t_{e1}$ to $t_{e2}$, $t_{e2}$ to $t_{e3}$, ... $t_{en-1}$ to $t_{en}$). The entire gradient field can be set to velocity sensitize spins moving in any direction, or the gradient field along one or two axes of motion can be set to velocity sensitize for spin motion along those axes alone.

Figure 4A:
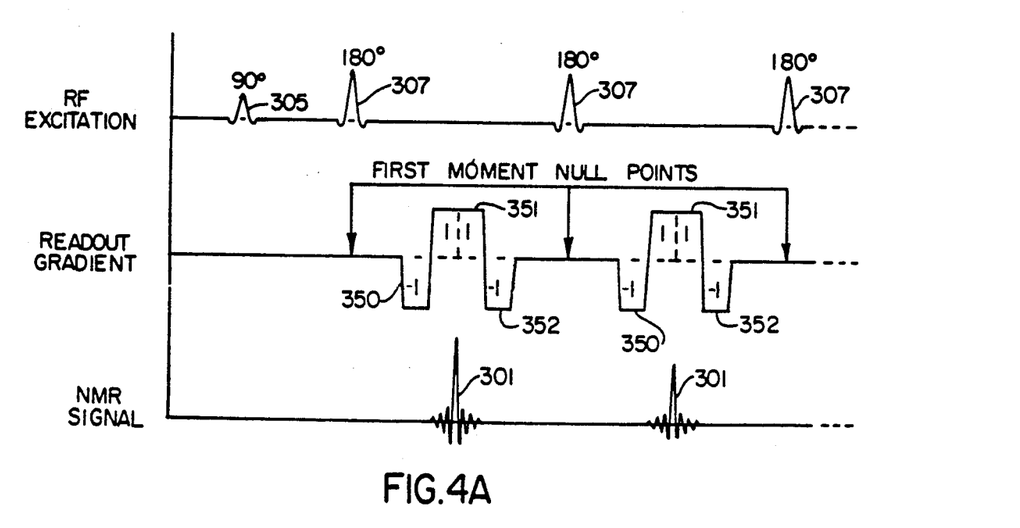
FIGS. 4A–C are graphic representations of three modification to the readout gradient in the pulse sequence of FIG. 3 to practice the present invention.

Referring particularly to FIG. 4A, the application of the present invention to the readout gradient in the fast spin echo pulse sequence of FIG. 3 is shown. In this embodiment the −1, +2, −1 symmetric readout gradient pulses 350, 351 and 352 are applied at each echo signal 301 to null the first moment of the readout gradient at the center of the subsequent RF refocusing pulse 307. As a result, the relative phase of the stimulated echo component and the spin echo component in subsequent NMR echo signals is not affected by the velocity of spins flowing in the direction of the readout gradient. However, the first moment of the readout gradient is not nulled at the center of the NMR echo signals 301, and the NMR echo signal 301 will be velocity sensitized to spins flowing in the direction of the readout gradient. This first moment is produced by the −1 pulse 350 and the +1 first half of the pulse 351.

Figure 4B:
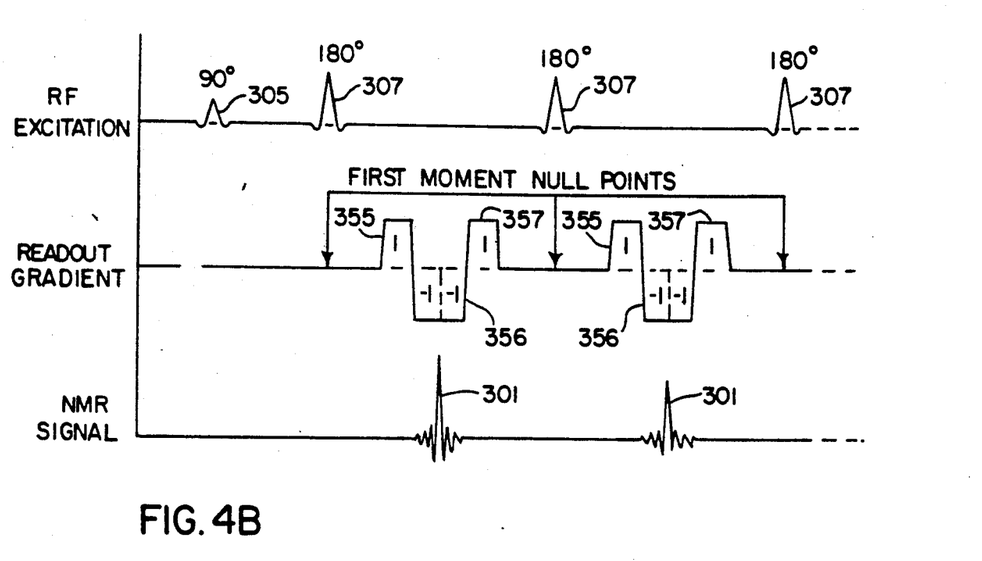

To practice the preferred embodiment of the present invention a complete data set is acquired with the pulse sequence of FIG. 4A and a complete data set is acquired with the pulse sequence of FIG. 4B. This second pulse sequence is identical to the first, except the symmetric readout gradient pulses 355, 356 and 357 are +1, −2, +1 to provide a first moment at each echo signal 301 which is opposite in sign to the first moment produced in the first pulse sequence of FIG. 4A. As above, however, the first moment of the readout gradient is nulled at the center of each 180° RF refocusing pulse 307 such that the stimulated echo and spin echo components are kept in phase and properly add to enhance the NMR echo signals 301. Preferably the two pulse sequences are interleaved such that NMR data is acquired first with one pulse sequence and then NMR data is acquired with the other pulse sequence at the same phase encoding value. At the completion of the scan, two complete 256 by 256 arrays of complex data points are acquired, one with the pulse sequence of FIG. 4A and one with the second pulse sequence of FIG. 4B.

As is well known in the art, a number of different processing methods can be employed to produce an angiogram from these two acquired data sets. In the preferred embodiment a two-dimensional complex Fourier transformation is performed on each of the two acquired data sets and the phase ($\phi$) of each element in each transformed data set is calculated from the real (I) and imaginary (Q) components:

$$\phi = \tan^{-1}(Q/I).$$

A phase map is then produced by subtracting each element in the 256 by 256 second phase array from the corresponding element in the first phase array. The result is a 256 by 256 pixel angiogram.

Figure 4C:
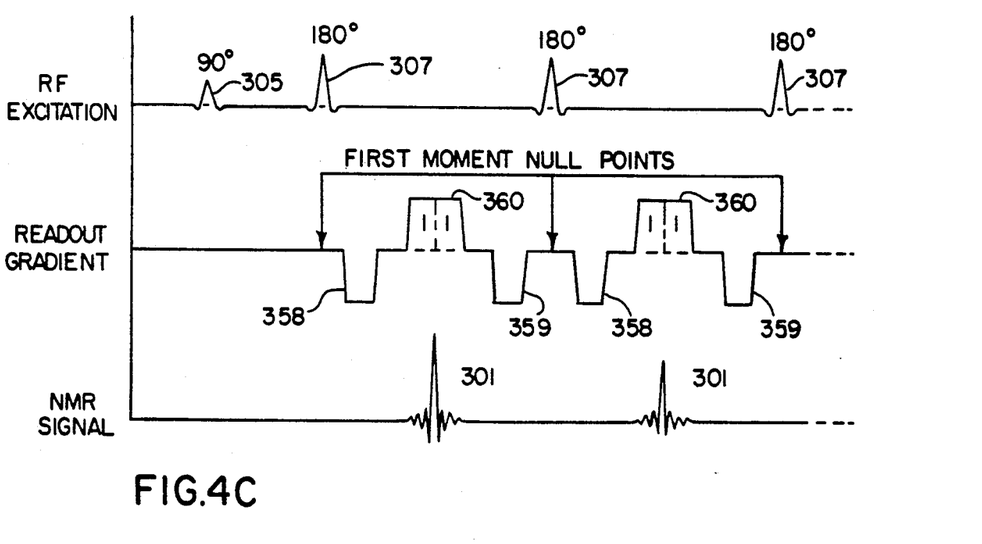

To produce an angiogram it is only necessary that the first moment of one or more magnetic field gradients differ in each of the two pulse sequences at the center of each echo signal 301. In the preferred embodiment of FIG. 4B this difference is accomplished by inverting the readout gradient pulse waveform. An alternative is shown in FIG. 4C in which a different first moment is obtained without inverting the readout gradient pulse waveform. In this embodiment a different first moment is produced in the symmetric −1, +2, −1 waveform by spacing the −1 pulses 358 and 359 from the +2 central pulse 360. The lengthened time interval over which the gradient pulses 358-360 are produced increases the first moment at each spin echo signal 301 and provides the desired first moment difference from the pulse sequence of FIG. 4A that is desired to produce an angiogram by the phase modulation technique. Yet another alternative is to produce one of the two NMR data sets using a fast pulse sequence in which the first moment is nulled at the center of the spin echo signals as well as at the center of the RF refocusing pulses. Such fast spin echo pulse sequences are disclosed in copending U.S. patent application Ser. No. 854,515 filed on Mar. 19, 1992 and entitled "Gradient Moment Nulling In a Fast Spin Echo NMR Pulse Sequence."

Figure 5A:
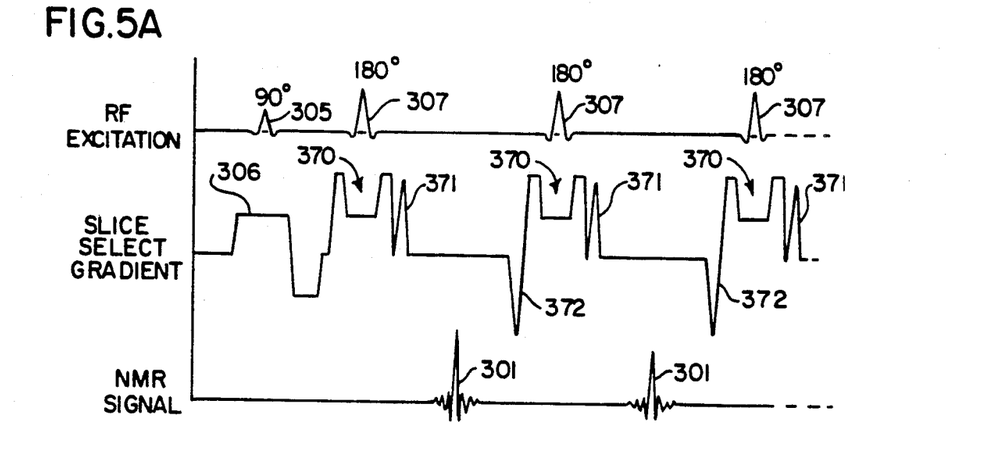
FIGS. 5A–C are graphic representations of three modification to the slice select gradient in the pulse sequence of FIG. 3 to practice the present invention.

To further enhance the angiogram quality, the slice select gradient pulses 370 produced concurrently with each 180° RF refocusing pulse 307 are also modified. Referring particularly to FIG. 5A, the improvement involves the application of a "projection dephasing" gradient pulse 371 in the slice select direction. This dephasing pulse 371 acts as a high-pass spatial filter in that NMR signals which are nearly uniform over the selected slice are attenuated due to the dephasing of spins by this pulse 371 prior to the readout of each echo signal 301. On the other hand, structures which are small relative to the distance over which this dephasing gradient pulse produces a $2\pi$ phase shift, such as blood vessels, experience little dephasing and, therefore, little signal loss. A compensating gradient pulse 372 of opposite sign is produced after acquisition of the echo signal 301 to unwind the induced phase twist prior to the next RF refocusing pulse 307.

Figure 5B:
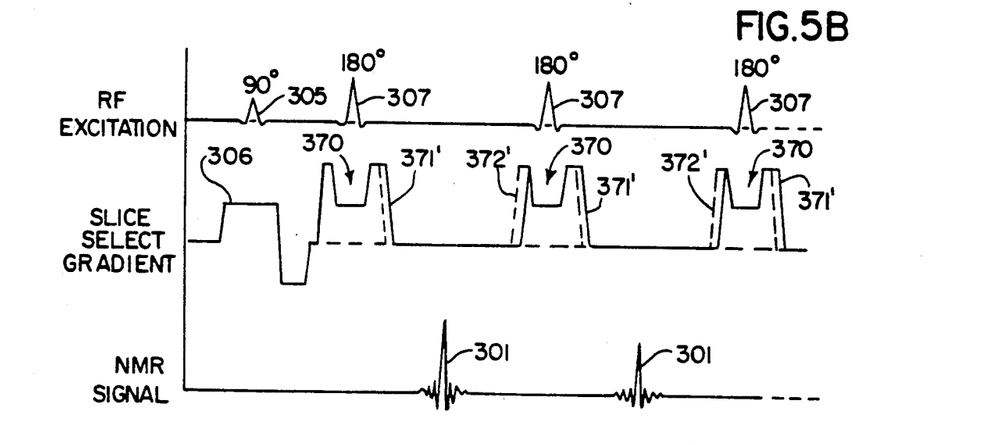
Figure 5C:
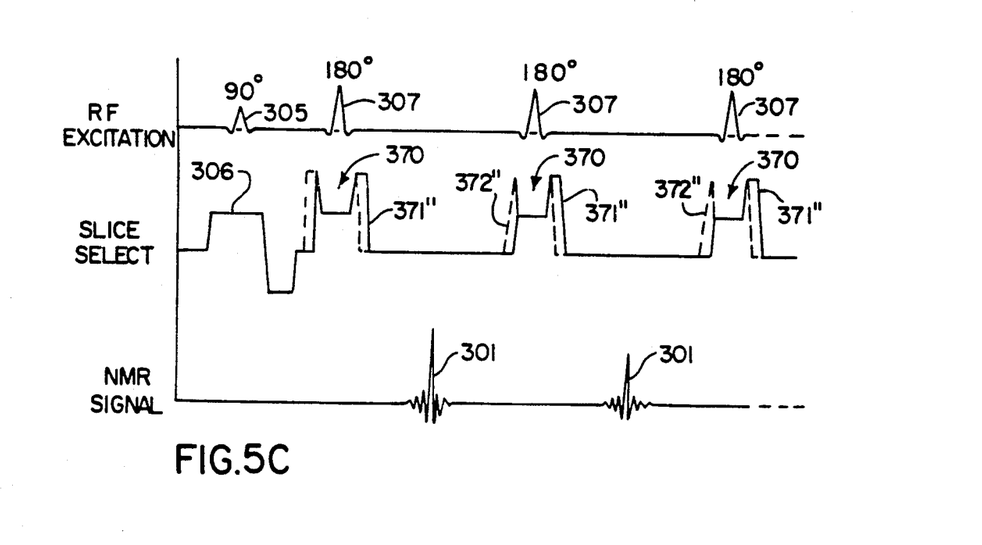

Rather than producing separate projection dephasing pulses, these pulses can be incorporated as an integral part of the crusher pulses which form part of the slice select gradient pulses 370. One such embodiment is shown in FIG. 5B where the dephasing gradient pulse is added to the trailing crusher pulse at 371', and the rewinder pulse is subtracted from the leading crusher pulse at 372'. This enables the dephasing gradient to be added without increasing the crusher size or increasing the echo signal spacing. In yet another embodiment of the invention shown in FIG. 5C, the total slice select gradient is reduced by modifying only the leading crusher pulse in the slice select gradient pulses 370. The dephasing gradient pulse is indicated at 371" and the corresponding rewinder pulse is indicated by the missing area 372". Overall slice select gradient loading is reduced by this embodiment of the invention.

While it is preferred that two fast spin echo pulse sequences with different gradient field first moments be employed during a scan and that the angiogram be reconstructed using the phase difference information in the two resulting NMR data sets, it is also possible to produce an angiogram from one NMR data set. One of the advantages of using the fast spin echo pulse sequence is that the RF refocused spin echo signal is immune from B$_0$ off-resonance effects such as field inhomogeneities, magnetic susceptibility and chemical shift. Therefore, most of the sources of phase shift in the NMR signal are eliminated and the remaining phase is due primarily to the velocity of spins in the direction of the gradient field having a first moment at the center of the spin echo signal An angiogram can therefore be reconstructed using the phase information from a single NMR data set acquired using any of the pulse sequences of FIGS. 4A, 4B or 4C.

It should be apparent to those skilled in the art that the present invention can also be applied using the slice select magnetic field gradient or the phase encoding magnetic field gradient to impart a velocity dependant phase shift to the RF refocused echo signal. As with the readout magnetic field gradient described above, the important factor is that the first moment of the magnetic field gradient be nulled at each RF refocusing pulse and that it have a net first moment at the center of each spin echo signal. It is possible to apply the present invention to one, two or all three magnetic field gradients used in the fast spin echo pulse sequence.

We claim:

1. A method for producing an angiogram with an NMR system, the steps comprising:
   a) producing transverse magnetization in a region of interest by applying an RF excitation field pulse to the nuclear spins in the region of interest in the presence of a first magnetic field gradient and a polarizing magnetic field;
   b) refocusing the transverse magnetization by applying a series of RF refocusing field pulses to the nuclear spins in the region of interest and in the presence of said first magnetic field gradient to produce a corresponding series of NMR echo signals;
   c) phase encoding each NMR echo signal by applying a second magnetic field gradient to the nuclear spins in the region of interest during the interval after each RF refocusing field pulse and prior to its corresponding NMR echo signal;
   d) acquiring each NMR echo signal in the presence of a third magnetic field gradient, said third magnetic field gradient having a first moment which is substantially zero at the center of each of said RF refocusing field pulses, but which has a first moment at the center of each acquired NMR echo signal of a first value;

e) storing the acquired NMR echo signals in a first data set;

f) repeating steps a through d with the third magnetic field gradient changed such that it has a first moment at the center of each acquired NMR echo signal of a second value and the acquired NMR echo signals are stored in a second data set; and g) producing an angiogram image from said first and second data sets.

2. The method as recited in claim 1 in which a dephasing pulse is added to the first magnetic field gradient following each of said RF refocusing field pulses and prior to the acquisition of the corresponding NMR echo signal, and a rewinder pulse is added to the first magnetic field gradient following each of said NMR echo signals and prior to the application of the next RF refocusing field pulse, wherein the dephasing pulse and the rewinder pulse have the same gradient area but opposite sign.

3. A method for producing an angiogram with an NMR system, using a fast spin echo pulse sequence, the steps comprising:

producing transverse magnetization in a region of interest by applying an RF excitation field pulse to the nuclear spins in the region of interest in the presence of a first magnetic field gradient and a polarizing magnetic field;

b) refocusing the transverse magnetization by applying a series of RF refocusing field pulses to the nuclear spins in the region of interest and in the presence of said first magnetic field gradient to produce a corresponding series of NMR echo signals;

c) phase encoding each NMR echo signal by applying a second magnetic field gradient to the nuclear spins in the region of interest during the interval after each RF refocusing field pulse and prior to its corresponding NMR echo signal;

d) acquiring each NMR echo signal in the presence of a third magnetic field gradient;

e) storing the acquired NMR echo signals in a first data set;

wherein one of said magnetic field gradients is modified to have a first moment which is substantially zero at the center of said RF refocusing field pulses and which has a substantial first moment at the center of each acquired NMR echo signal to motion sensitize each NMR echo signal; and f) producing an angiogram image from said first data set using the phase of said acquired NMR echo signals to determine image brightness.

4. The method as recited in claim 3 in which the third magnetic field gradient is modified.

5. The method as recited in claim 3 in which steps a through d are repeated with the modified magnetic field gradient changed such that it has a different first moment at the center of each acquired NMR echo signal and the acquired NMR echo signals are stored in a second data set; wherein the angiogram image is produced using the phase difference between corresponding acquired NMR echo signals in said first and second data set.

* * * * *